(12) United States Patent
Niaz

(10) Patent No.: US 9,494,067 B2
(45) Date of Patent: Nov. 15, 2016

(54) EMISSIONS CLEANING MODULE AND ASSOCIATED ELECTRONICS SUPPORT UNIT

(71) Applicant: Perkins Engines Company Limited, Cambridgeshire (GB)

(72) Inventor: Naseer A. Niaz, Cambridgeshire (GB)

(73) Assignee: Perkins Engines Company Limited, Peterborough (GB)

( * ) Notice: Subject to any disclaimer, the term of this patent is extended or adjusted under 35 U.S.C. 154(b) by 100 days.

(21) Appl. No.: 14/394,618

(22) PCT Filed: Dec. 7, 2012

(86) PCT No.: PCT/GB2012/053066
§ 371 (c)(1),
(2) Date: Oct. 15, 2014

(87) PCT Pub. No.: WO2013/160638
PCT Pub. Date: Oct. 31, 2013

(65) Prior Publication Data
US 2015/0086433 A1    Mar. 26, 2015

(30) Foreign Application Priority Data

Apr. 24, 2012   (GB) .................................. 1207201.3

(51) Int. Cl.
*B01D 50/00* (2006.01)
*F01N 3/20* (2006.01)
(Continued)

(52) U.S. Cl.
CPC ............. *F01N 3/20* (2013.01); *B01D 46/0002* (2013.01); *B01D 46/0057* (2013.01);
(Continued)

(58) Field of Classification Search
CPC ................... F01N 3/0233; F01N 3/021; F01N 13/14; F01N 3/08; F01N 3/2892; F01N 2260/022; F01N 13/18
(Continued)

(56) References Cited

U.S. PATENT DOCUMENTS 5,576,933 A    11/1996   Campanella et al.
7,192,463 B2    3/2007   Shutty et al.
(Continued)

FOREIGN PATENT DOCUMENTS

CN     201953456        8/2011
EP     2028095 A2       2/2009

OTHER PUBLICATIONS

European Patent Office, International Search Report in International Patent Application No. PCT/GB2012/053066, Mar. 26, 2013, 4 pp.

*Primary Examiner* — Tom P Duong

(57) ABSTRACT

An emissions cleaning module electronics support unit includes a base member which defines at least one seating location for an electronics module; and a roof member includes a first end joined to the base member and a second end, distal the base member, coupled to a brace or one or more conduits of the emissions cleaning module. The roof member may be shaped to extend up and over the base member so as to create an open-mouthed cavity. The base member may include one or more apertures creating tortuous thermal paths between the attachment member and electronics module seating location.

18 Claims, 4 Drawing Sheets

(51) Int. Cl.

| | | |
|---|---|---|
| *F01N 3/28* | (2006.01) | |
| *F01N 13/08* | (2010.01) | |
| *F01N 13/00* | (2010.01) | |
| *F01N 13/14* | (2010.01) | |
| *F01N 13/18* | (2010.01) | |
| *F01N 3/021* | (2006.01) | |
| *F01N 3/02* | (2006.01) | |
| *F01N 3/023* | (2006.01) | |
| *G01M 15/10* | (2006.01) | |
| *B60R 13/08* | (2006.01) | |
| *B01D 46/00* | (2006.01) | |
| *F01N 3/08* | (2006.01) | |
| *B01D 53/86* | (2006.01) | |
| *F01N 3/035* | (2006.01) | |
| *B01D 53/92* | (2006.01) | |
| *F01N 9/00* | (2006.01) | |
| *H05K 5/02* | (2006.01) | |
| *H05K 7/20* | (2006.01) | |
| *B01F 5/06* | (2006.01) | |
| *F01N 1/08* | (2006.01) | |

(52) U.S. Cl.
CPC .............. *B01D 53/864* (2013.01); *B01D 53/92* (2013.01); *B60R 13/0876* (2013.01); *F01N 3/02* (2013.01); *F01N 3/021* (2013.01); *F01N 3/0233* (2013.01); *F01N 3/035* (2013.01); *F01N 3/08* (2013.01); *F01N 3/28* (2013.01); *F01N 3/2892* (2013.01); *F01N 9/00* (2013.01); *F01N 13/00* (2013.01); *F01N 13/008* (2013.01); *F01N 13/08* (2013.01); *F01N 13/14* (2013.01); *F01N 13/143* (2013.01); *F01N 13/18* (2013.01); *F01N 13/1805* (2013.01); *G01M 15/102* (2013.01); *H05K 5/02* (2013.01); *H05K 7/20436* (2013.01); *B01F 5/0613* (2013.01); *B01F 2005/0621* (2013.01); *B01F 2005/0636* (2013.01); *F01N 1/086* (2013.01); *F01N 2240/20* (2013.01); *F01N 2260/022* (2013.01); *F01N 2260/20* (2013.01); *F01N 2450/22* (2013.01); *F01N 2470/04* (2013.01); *F01N 2490/06* (2013.01); *F01N 2610/1453* (2013.01); *Y10T 29/49345* (2015.01)

(58) Field of Classification Search
USPC .......................... 422/168; 55/395.1, 385.75
See application file for complete search history.

(56) References Cited

U.S. PATENT DOCUMENTS

| | | | |
|---|---|---|---|
| 7,324,342 B2* | 1/2008 | Taylor | H01L 23/4093 |
| | | | 165/104.33 |
| 2008/0223329 A1* | 9/2008 | Preimesberger | F02B 67/10 |
| | | | 123/195 A |
| 2009/0050392 A1 | 2/2009 | Kakuta | |
| 2009/0242295 A1 | 10/2009 | Hosoda | |
| 2010/0186394 A1* | 7/2010 | Harrison | F01N 3/103 |
| | | | 60/299 |
| 2010/0187383 A1 | 7/2010 | Olsen et al. | |

* cited by examiner

EMISSIONS CLEANING MODULE AND ASSOCIATED ELECTRONICS SUPPORT UNIT

TECHNICAL FIELD

The disclosure relates to an apparatus for cleaning fluids emitted during the operation of combustion engines.

BACKGROUND

Engines, for example IC engines burning gasoline, diesel or biofuel, output various harmful substances which must be treated to meet current and future emissions legislation. Most commonly those substances comprise hydrocarbons (HC), carbon monoxides (CO), mono-nitrogen oxides ($NO_x$) and particulate matter, such as carbon (C), a constituent of soot. Some of those substances may be reduced by careful control of the operating conditions of the engine, but usually it is necessary to provide an emissions cleaning module downstream of the engine to treat at least some of those substances entrained in the exhaust gas. Various apparatus for reducing and/or eliminating constituents in emissions are known. For example, it is known to provide an oxidation device, such as a diesel oxidation catalyst, to reduce or to eliminate hydrocarbons (HC) and/or carbon monoxide (CO). Oxidation devices generally include a catalyst to convert those substances into carbon dioxide and water, which are significantly less harmful. As a further example, emissions cleaning modules may include a particulate filter to restrict the particulates present in the exhaust gas from being output to atmosphere.

By use of an emissions cleaning module, engine emissions can be cleaned, meaning that a proportion of the harmful substances which would otherwise be released to atmosphere are instead converted to carbon dioxide ($CO_2$), nitrogen ($N_2$) and water ($H_2O$).

The emissions cleaning module may comprise one or more electronic components for interfacing with one or more sensors of the emissions cleaning module. Such sensors may include temperature and $NO_x$ sensors. U.S. Pat. No. 7,192,463 describes a mounting bracket for mounting electronic components to an exhaust gas after treatment filter system. The mounting bracket comprises a plurality of mounting feet which limit the contact area with the after treatment filter system and also provides an air gap. However, the electronic components on the mounting bracket may still be subject to thermal impacts and also may be prone to mechanical damage as they are relatively exposed.

Against this background there is provided an emissions cleaning module and an associated electronics support unit.

SUMMARY OF THE DISCLOSURE

The present disclosure provides an emissions cleaning module comprising:
 a first support;
 a second support;
 a brace extending between the first support and the second support; and
 one or more fluid-treatment modules located in one or more conduits extending between the first support and the second support, and an electronics support unit comprising:
 a base member which defines at least one seating location for an electronics module; and
 a roof member;
 wherein, the roof member comprises a first end adjacent the base member and a second end, distal the base member, which is coupled to the brace and/or the one or more conduits;
 the roof member being shaped to extend up and over the base member such that a cavity is defined between the base member and the roof member and configured for receiving an electronics module to be seated at the at least one seating location.

The present disclosure also provides an electronics support unit comprising:
 a base member which defines at least one seating location for an electronics module; and
 a roof member;
 wherein, the roof member comprises a first end adjacent the base member and a free-standing second end distal the base member;
 the roof member being shaped to extend up and over the base member such that a cavity is defined between the base member and the roof member and configured for receiving an electronics module to be seated at the at least one seating location.

The present disclosure further provides an electronics support unit comprising:
 a base member which defines at least one seating location for an electronics module; and
 an attachment member;
 wherein, the attachment member comprises a first end adjacent the base member and a second end distal the base member;
 wherein the base member comprises one or more apertures creating one or more tortuous thermal paths between the attachment member and the at least one seating location for an electronics module.

BRIEF DESCRIPTION OF THE DRAWINGS

The present disclosure will now be described, by way of example only, with reference to the accompanying drawings in which.

DETAILED DESCRIPTION

Figure 1:
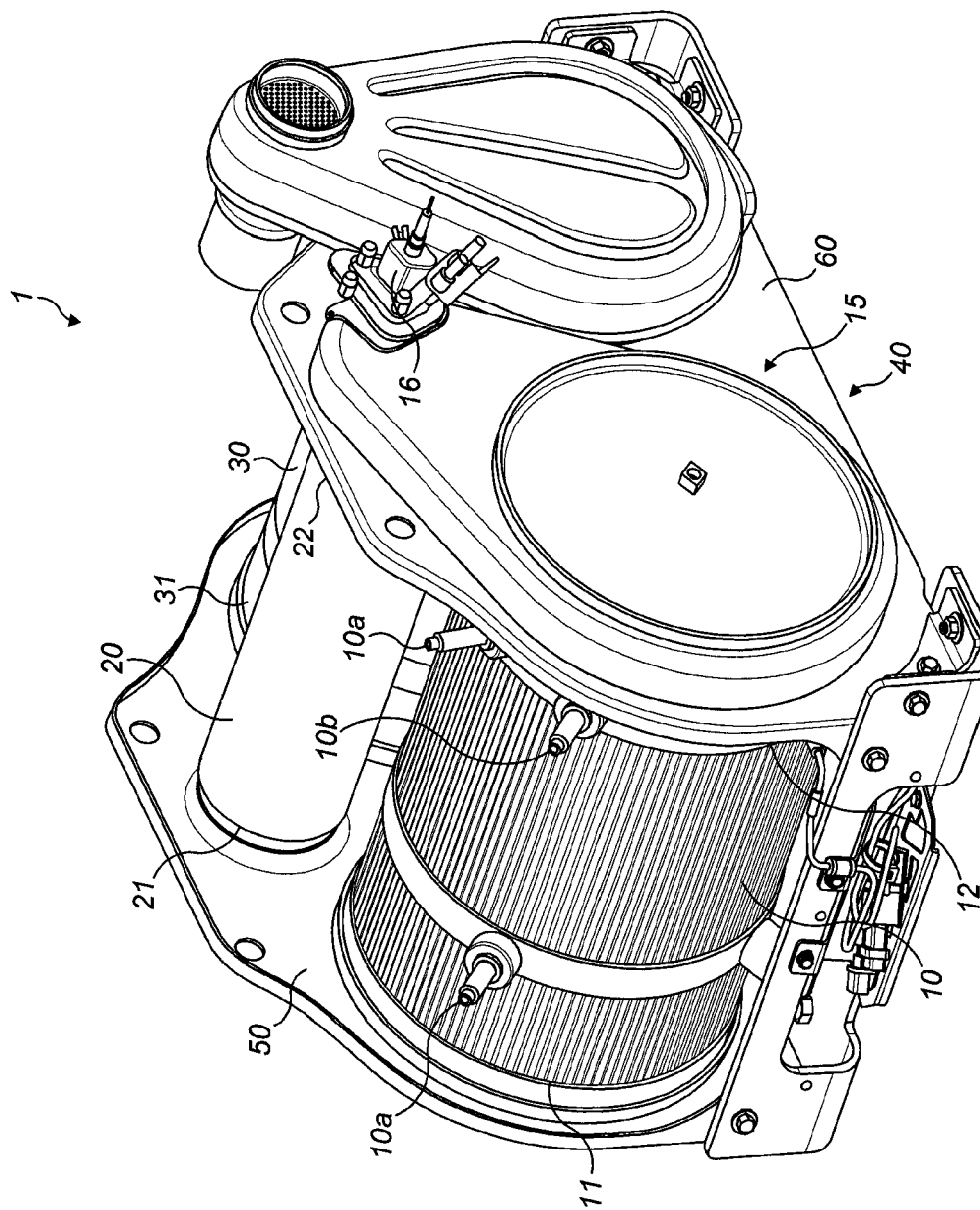
FIG. 1 shows an emissions cleaning module in accordance with the present disclosure.

An emissions cleaning module 1 is illustrated in FIG. 1.

The emissions cleaning module 1 may comprise a first conduit 10 and a second conduit 20. A third conduit 30 and a support structure 40 may also be present. The support structure 40 comprises a first support member 50 and a second support member 60.

Each support member 50, 60 may be generally planar and may be of rigid material, for example metal.

The first, second and third conduits 10, 20, 30 may be elongate, having an axis of elongation, and may have substantially constant cross-section along the axis of elongation. The first, second and third conduits 10, 20, 30 may be substantially cylindrical.

The first conduit 10 comprises a first end 11 providing an inlet to the conduit and a second end 12 providing an outlet to the conduit. The second conduit 20 comprises a first end 21 providing an outlet to the conduit and a second end 22 providing an inlet to the conduit. The third conduit 30 may comprise a first end 31 providing an inlet to the conduit and a second end (not shown) providing an outlet to the conduit.

The conduits 10, 20, 30 may extend between the support members 50, 60. The conduits 10, 20, 30 may be generally substantially parallel. The first ends 11, 21, 31 of the first, second and third conduits 10, 20, 30 may be received in and may be shaped to correspond with first, second and third openings 51, 52, 53, respectively, of the first support member 50. The second ends 12, 22 of the first, second and third conduits 10, 20, 30 may be received in and may be shaped to correspond with first, second and third openings 61, 62, 63, respectively, of the second support member 60. By this arrangement, lateral movement of the conduits may be restricted.

Figure 2:
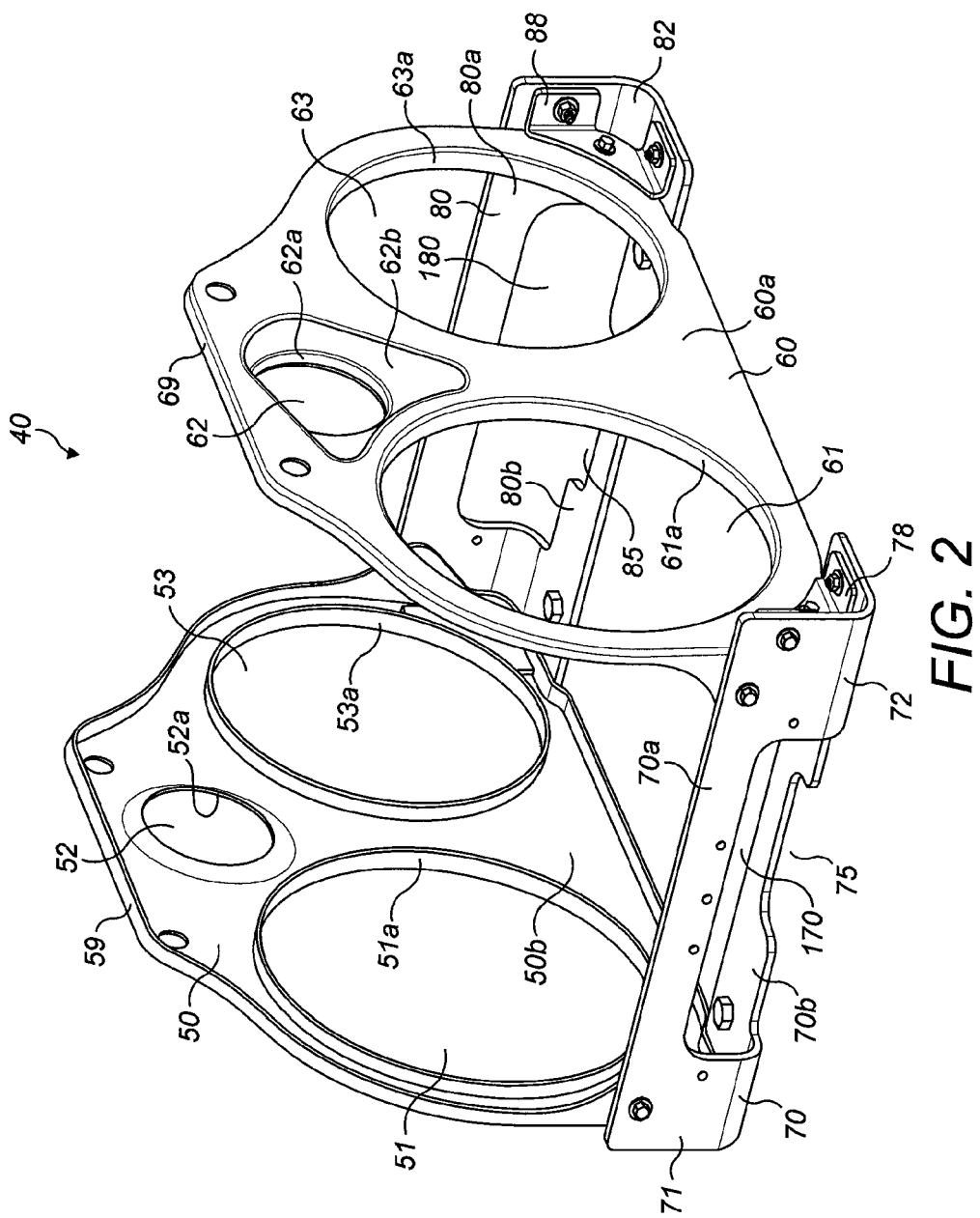
FIG. 2 shows a support frame of the emissions cleaning module of FIG. 1.
Figure 3:
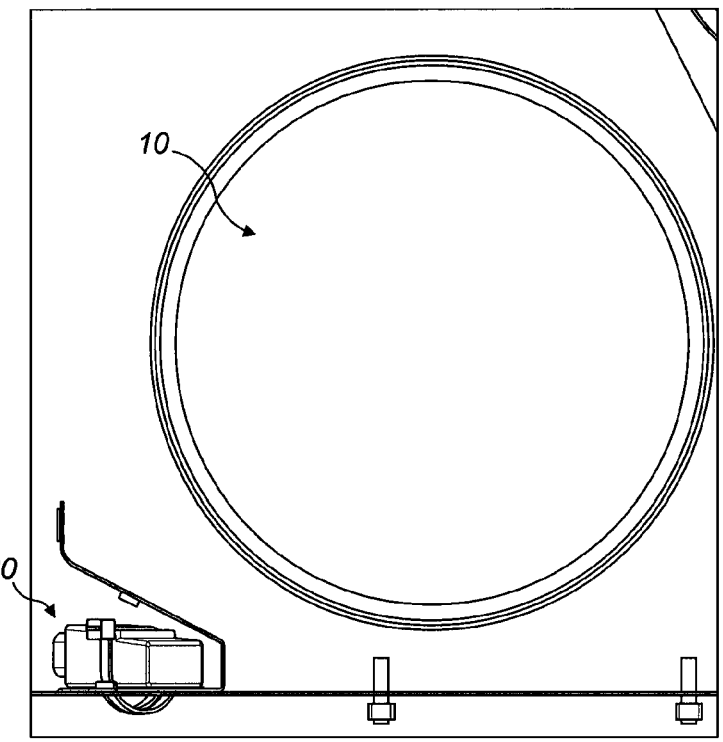
FIG. 3 shows a partial cross-section of the emissions cleaning module of FIG. 1.

As shown in FIG. 2, each opening 51, 52, 53, 61, 62, 63 may comprise a flange 51a, 52a, 53a, 61a, 62a, 63a extending around a perimeter of the opening. Each support member 50, 60 may further comprise an inwardly turned lip 59, 69 extending at least part way around a periphery of the support member 50, 60.

The conduits 10, 20, 30 may all be of substantially similar length. The first conduit 10 may have a first diameter, the second conduit 20 may have a second diameter and the third conduit 30 may have a third diameter. The second diameter may be smaller than the first and third diameters.

The first and second ends 11, 21, 31, 12, 22 of the conduits 10, 20, 30 may be welded, adhered or otherwise secured to portions of the support members 50, 60 defining or surrounding the openings. Alternatively, first and second ends 11, 21, 31, 12, 22 of the conduits 10, 20, 30 may abut the inner sides of the support members 50, 60 so as to overlie respective openings in the support members 50, 60.

The first, second and third conduits 10, 20, 30 and the first and second support members 50, 60 may be interconnected in a manner which restricts relative translational movement of those components. Instead or in addition, the first, second and third conduits 10, 20, 30 and the first and second support members 50, 60 may be interconnected in a manner which restricts rotational movement of one component with respect to another.

The first conduit 10 is fluidly coupled to the second conduit 20 via a first end coupling 15 which fluidly connects the outlet of the first conduit 10 to the inlet of the second conduit 20. The first end coupling 15 may comprise an injector module 16. The second conduit 20 may be coupled to the third conduit 30 via a second end coupling (not shown) for fluidly connecting the outlet of the second conduit 20 to the inlet of the third conduit 30. Each of the first and second end couplings may define, in combination with its respective support member, a fluid flow path through which exhaust gas may pass between adjacent conduits.

The support structure 40 may further comprise a first brace 70 and a second brace 80. Each of the first and second braces 70, 80 may comprise a longitudinal beam possibly having an L-shaped cross section. Each brace may include a cut-out defined partway between the ends, which may be in the form of an aperture 170, 180. Consequently, the cross section in a region of the longitudinal direction of each beam may comprise two mutually perpendicular and unconnected flanges 70a, 70b, 80a, 80b. Put another way, each brace 70, 80 may be formed from a rectangular plate having four edges and the aperture 170, 180 is disposed in the plate and distal from the plate's edges. The plate is then folded to define the two flanges such that the fold line intersects the aperture 170, 180.

The apertures 170, 180 of the first and second braces 70, 80 may each comprise a wide aperture portion 75, 85 towards the centre of the braces and narrow aperture portions on each side of the wide aperture portion 75, 85.

The first and second braces 70, 80 may each be parallel to the elongate axis of each of the first, second and third conduits 10, 20, 30. The first brace 70 may be connected at a first end 71 to the first end plate 50 and at a second end 72 to the second end plate 60. Similarly, the second brace 80 may be connected at a first end 81 to the first end plate 50 and at a second end 82 to the second end plate 60.

The means of connection between the first and second braces 70, 80 and the first and second end plates 50, 60 may be one or more components 78, 88 independent from the braces 70, 80 and the end plates 50, 60 or may be integral to the braces 70, 80 and/or the end plates 50, 60. Alternatively, the means of connection may be a combination of one or more independent components and features integral to the braces 70, 80 and/or the end plates 50, 60.

The means of connection may comprise connectors 78, 88 which may comprise a plate-like member having two perpendicular edges, each of which is provided with a flange arranged perpendicular to the plate-like member and each other. The flanges may each comprise means for fixing to that portion of the L-shaped brace 70, 80 with which it is parallel. The plate-like member may be configured such that it does not extend to the interior corner of the L-shape of the L-shaped brace 70, 80 so as to provide a passage for fluid from one side of the connector to the other side of the connector. This may avoid liquid collecting in between the interior surfaces of the L-shaped brace 70, 80 and the plate-like member of the connector.

The first and second end plates 50, 60 and the first and second braces 70, 80 may together form a rigid rectangular structure which may serve a purpose of holding the three conduits 10, 20, 30 relative to one another whilst accommodating differential expansion and/or contraction of components relative to each other.

An inlet for fluid emitted from a diesel engine may be provided at the first end 11 of the first conduit 10 such that said fluid passes into a first portion of the first conduit 10.

An outlet for fluid from the emissions cleaning module 1 may be provided at the second end of the third conduit such that fluid may be released from the emissions cleaning module 1, perhaps into atmosphere.

Within the fluid flow path of the emissions cleaning module there may be located a diesel oxidation catalyst (DOC) module, a diesel particulate filter (DPF) module, an injector module 16, a mixer module, a selective catalyst reduction (SCR) module and an ammonia oxidation catalyst (AMOX) module.

The DOC module may be located in a first portion of the first conduit 10 towards the first, inlet, end 11 of the first conduit 10. The DPF module may be located in a second portion of the first conduit 10 towards the second, outlet, end 12 of the first conduit 10. The first end coupling 15 may provide a fluid flow path from the second end 12 of the first conduit 10 to the second end 22 of the second conduit 20. The first end coupling 15 may comprise the injector module 16.

The mixer module may be located in, or formed by, the second conduit 20. The mixer module may be configured to mix a fluid injected by the injector module 16 with a fluid arriving from the first conduit 10. The mixer module may comprise multiple features, such as interspersed fins, which may give rise to an even blend of the injected fluid with the fluid from the first conduit 10. The second end coupling may provide a fluid flow path from the first end 21 of the second conduit to the first end 31 of the third conduit 30.

The SCR module may be located in a first portion of the third conduit 30 towards the first end 31 of the third conduit 30. The SCR module may comprise a catalyst surface intended to catalyse a reaction to occur between the two fluids mixed in the mixer module and output by the diffuser. The AMOX module may both be located in a second portion of the third conduit 30 towards the second end of the third conduit 30. The AMOX module may comprise a catalyst which may catalyse a reaction of one or more of the products output from the SCR module.

The emissions cleaning module 1 may comprise one or more sensors for sensing one or more conditions in the emissions cleaning module 1, such as temperature or quantity of $NO_R$. Each sensor 10a, 10b, 10c may penetrate a conduit 10, 20, 30 of the emissions cleaning module such that those elements of the sensor (i.e. electronic components) which need not be located within a volume to be sensed may be located on an exterior surface of the conduits 10, 20, 30. In this manner, sensitive elements of the sensors can be located away from high temperatures likely to occur inside the conduit.

In addition, the sensors 10a, 10b, 10c may be connected to one or more electronics modules 110a, 110b by means of leads 130. The electronics modules 110a, 110b may thus be positioned out of direct contact with the exterior surface of the conduits 10, 20, 30. As shown in FIGS. 3 to 6, an electronics support unit 180 may be provided on which to locate and secure the one or more electronics modules 110a, 110b.

The electronics support unit 180 may comprise a base member 181 and a roof member 182. The base member 181 may be generally flat. The base member 181 may have a front edge 181a, a rear edge 181b and side edges 181c, 181d joining the front edge to the rear edge. The base member 181 may be generally rectangular. The front edge may be provided with a downturned lip 189. The base member 181 may comprise a plurality of apertures 120a-120e. The base member 181 may further comprise seating locations 130a, 130b for the electronics modules 110a, 110b. The seating locations 130a, 130b may be interposed between the apertures 120a-120e. The base member 181 may be provided with one or more upstanding tabs 196 adjacent the seating locations 130a, 130b which may assist in restricting lateral movement of the electronics modules 110a, 110b when seated in the seating locations 130a, 130b.

The roof member 182 may be curved, folded or otherwise adopt a non-flat shape. The roof member 182 may extend upwardly from the rear edge of the base member 181. The roof member 182 may be joined to the base member 181 along the rear edge. The base member 181 and roof member 182 may be integrally formed from a single folded sheet of material, such as metal plate. An air gap 100 may be created between the roof member 182 and the conduits 10, 20, 30 (or any heat shield provided covering the conduits). The air gap 100 may allow for a rising air flow to pass between the electronics support unit 80 and the conduits 10, 20, 30.

Figure 5:
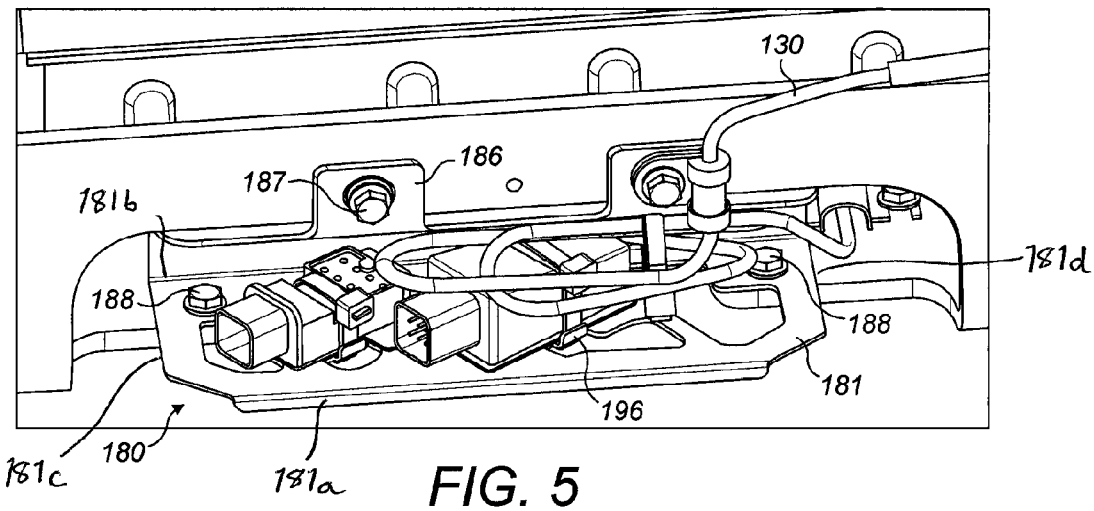
FIG. 5 shows a perspective view of an electronics support unit in accordance with the present disclosure.
Figure 6:
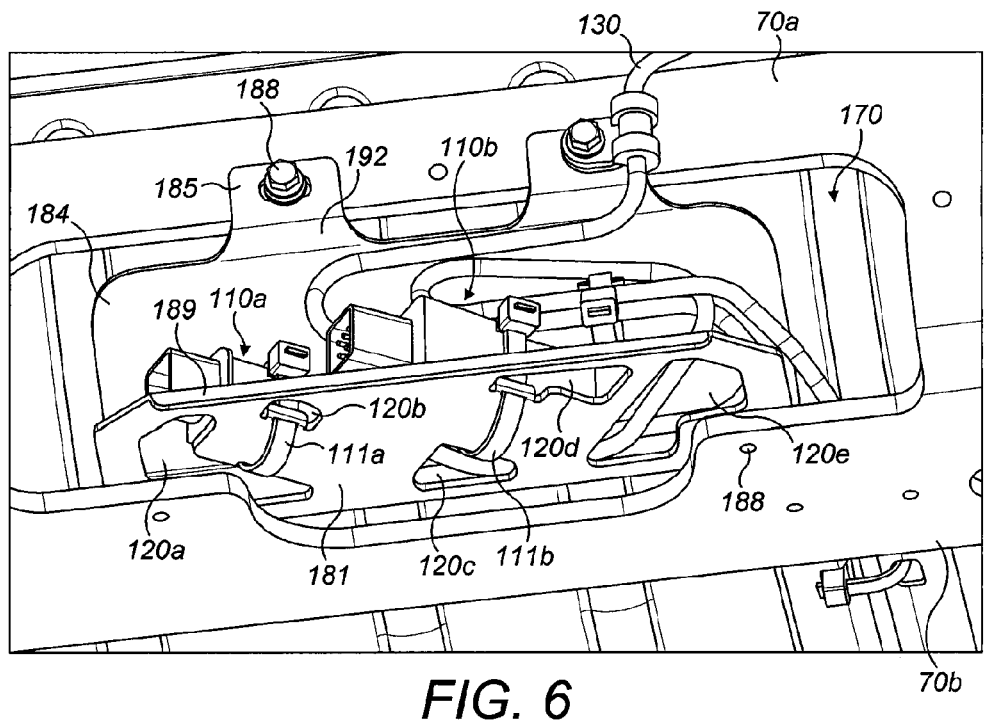
FIG. 6 shows a perspective view of the electronics support unit of FIG. 5 from another angle.

The roof member 182 may be shaped so as to extend up and over the base member 181. The roof member 182 may comprise a first end 183 which may be adjacent the rear edge of the base member 181. The first end 183 may take the form of a first wall section which may be perpendicular to the base member 181. The first end 183 may connect to a sloping roof section 184 via a first bend 191. The sloping roof section 184 may connect to a second end 185 of the roof member 182. The second end 185 may be parallel to the first end 183. The second end 185 may take the form of two tabs each of which may define an attachment point 186 for coupling the electronics support unit 180 to the first flange 70a of the first brace 70 as shown in FIGS. 5 and 6. Alternatively, the electronics support unit 180 may be attached to the second brace 80 or another part of the support structure 40. The attachment points 186 may be apertures arranged to cooperate with mechanical fastening means, such as bolts, to connect the electronics support unit 180 to the first brace 70.

Additional attachment points 188 may be provided between the base member 181 and the second flange 70b of the first brace 70 as shown in FIG. 5. The electronics support unit 180 may be fixed to the first brace 70 so as to be mainly or wholly located within the aperture 75. Thus the first brace 70 may provide physical protection to the electronics support unit minimising the chance of the electronics modules 110a, 110b being knocked. Alternatively, the electronics support unit may fixed to the second brace 80.

Figure 4:
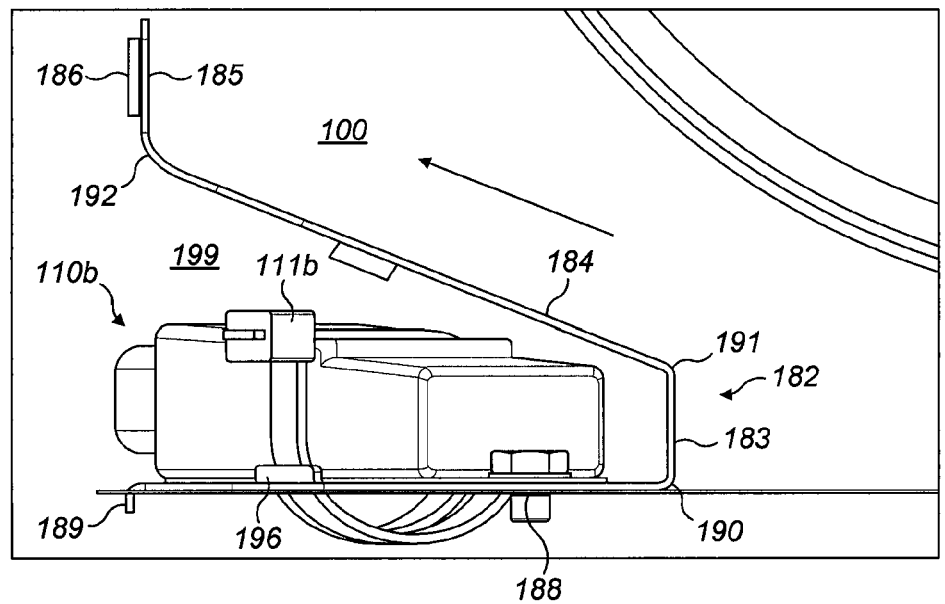
FIG. 4 shows an enlargement of a portion of FIG. 3.

The shaping of the base member 181 and the roof member 182 may create a cavity 199 there between, in which may be located the electronics modules 110a, 110b when attached to the base member 181 as shown in FIG. 4. The cavity 199 may be accessible from a front or from sides of the electronics support unit 180. The roof member 182 may act as a heat shield between the electronics support unit and the conduits 10, 20, 30.

The apertures 120a-120e may provide a means of attaching the electronics modules 110a, 110b to the base member 181. For example, cable ties 111a, 111b may be used to attach each electronics module 110a, 110b. As shown in FIG. 6, a first cable tie 111a may pass through apertures 120a and 120b and around electronics module 110a seated in seating location 130a. Likewise, a second cable tie 111b may pass through apertures 120c and 120d and around electronics module 110b seated in seating location 130b.

One or more cable ties may also be used to secure the leads 130.

The apertures 120a-120e may serve to increase the path length for thermal conduction of heat conducting through the electronics support unit 80 compared to a base member 181 formed from a substantially solid plate. The apertures 120a-120e may be arranged so that the remaining material of the base member 181 forms a series of relatively thin and/or tortuous sections. The first brace 70 of the emissions cleaning module 1 may be heated during use of the emissions cleaning module 1 by heat emanating from the one or more conduits 10, 20, 30. Heat from the first brace 70 may be conducted to the electronics support unit 180 via the attachment points 186, 188. However, the relatively thin and/or tortuous sections of the base member 181 may increase the path length that heat must conduct through the base member 181 before it can reach the seating locations 130a, 130b of the electronics modules 110a, 110b and/or reduce the available material for heat conduction. This may significantly reduce the heat imparted to the electronics modules 110a, 110b during use of the emissions cleaning module 1.

The emissions cleaning module 1 may be provided with a cable support for directing cables to the electronics support unit 80. The cable support may comprise a rigid elongate member disposed between the braces and to which cables may be secured. Thus, cables connecting to sensors on a module associated with one brace 70 or 80 may be guided to the electronics support module 80 provided on the other brace 80 or 70.

In use, fluid may be supplied to the emissions cleaning module 1 via an inlet 4. Fluid may pass into the DOC module in the first portion of the first conduit 10. Prior to receipt at the inlet 4, the pressure of the fluid may be controlled by a back pressure valve.

The DOC module may comprise one or more catalysts, such as palladium or platinum. These materials serve as catalysts to cause oxidation of hydrocarbons ([HC]) and carbon monoxide (CO) present in the fluid flow in order to produce carbon dioxide ($CO_2$) and water ($H_2O$). The catalysts may be distributed in a manner so as to maximise the surface area of catalyst material in order to increase effectiveness of the catalyst in catalysing reactions.

Fluid may flow from the DOC module to the DPF module which comprises features which are intended to prevent onward passage of carbon (C) in the form of soot. Carbon particles in the fluid may thus trapped in the filter. The filter may be regenerated through known regeneration techniques. These techniques may involve controlling one or more of the temperature of the fluid, the pressure of the fluid and the proportion of unburnt fuel in the fluid.

Fluid may pass from the DOC module past the injector module 16 located within the first end coupling 15. The injector module 16 may be associated with or attachable to a pump electronic tank unit (PETU). The pump electronic tank unit may comprise a tank for providing a reservoir for fluid to be injected by the injector. Such fluids may include urea or ammonia. The tank may comprise a lower portion having a first cross sectional area and an upper portion having a second cross sectional area. The second cross sectional area may be smaller than the first cross sectional area. The difference in cross sectional area between the first and second portions may provide for a volume to house additional components of the PETU. This may provide better protection than if components were simply attached to an otherwise external surface of the tank.

The PETU may further comprise a controller configured to control a volume of fluid to be injected from the tank by the injector. The controller may have as inputs, for example, temperature information and quantity of NO information which may be derived from sensors in the SCR module.

Fluid may pass from the injector module 16 into the mixer module located in the second conduit 20. The mixer module may comprise features for ensuring that the fluid originating from the first conduit 10 is well mixed with the fluid originating from the injector 16.

Fluid may then pass via the second end coupling into the SCR module located in the first portion of the third conduit via the second end coupling. The SCR module may comprise one or more catalysts through which the mixture of exhaust gas and urea/ammonia may flow. As the mixture passes over the surfaces of the catalyst a may reaction occur which converts the ammonia and $NO_x$ to diatomic nitrogen ($N_2$) and water ($H_2O$).

Fluid may pass from the SCR module to the AMOX module located in the second portion of the third conduit 30. The AMOX module may comprise an oxidation catalyst which may cause residual ammonia present in the fluid exiting the SCR module to react to produce nitrogen ($N_2$) and water ($H_2O$).

Fluid may pass from the AMOX module to the emissions cleaning module outlet located at the second end of the third conduit 30.

INDUSTRIAL APPLICABILITY

The present disclosure provides an emissions cleaning module and an associated electronics support unit. The electronics support unit provides improved mechanical protection for electronics units and reduces the impact of thermal effects.

The invention claimed is:

1. An emissions cleaning module comprising:
a first support;
a second support;
a brace extending between the first support and the second support; and
one or more fluid-treatment modules located in one or more conduits extending between the first support and the second support, and an electronics support unit comprising:
a base member which defines at least one seating location for an electronics module; and
a roof member;
wherein, the roof member comprises a first end adjacent the base member and a second end, distal the base member, which is coupled to the brace and/or the one or more conduits;
the roof member being shaped to extend up and over the base member such that a cavity is defined between the base member and the roof member and configured for receiving an electronics module to be seated at the at least one seating location, wherein the brace includes a cut-out in which the electronics support unit is at least partially located.

2. An emissions cleaning module as claimed in claim 1 wherein the roof member is a heat shield for shielding an electronics module seated at the at least one seating location from heat emanating from the one or more fluid-treatment modules.

3. An emissions cleaning module as claimed in claim 1 wherein an air flow gap is provided between the roof member and the one or more fluid-treatment modules.

4. An emissions cleaning module as claimed in claim 1 wherein the electronics support unit depends from the brace and/or the one or more conduits.

5. An emissions cleaning module as claimed in claim 1 wherein the brace is elongate and has an L-shaped cross-section defining first and second flanges joined along a common edge, and arranged at an angle to each other, the cut-out being formed in the first and second flanges so as to be intersected by the common edge.

6. An emissions cleaning module as claimed in claim 1 wherein the base member and the roof member are integrally formed.

7. An emissions cleaning module as claimed in claim 1 wherein the base member comprises a front edge, a rear edge and side edges joining the front edge and the rear edge; wherein the roof member extends upwardly from the rear edge of the base member; wherein the cavity is accessible from the front edge or the side edges of the base member.

8. An emissions cleaning module as claimed in claim 1 wherein the second end of the roof member comprises one or more attachment points for coupling the roof member to the brace and/or the one or more conduits.

9. An emissions cleaning module as claimed in claim 1 wherein the base member comprises a substantially flat plate.

10. An emissions cleaning module as claimed in claim 1 wherein the base member comprises one or more upstanding tabs to define the at least one seating location for an electronics module.

11. An emissions cleaning module as claimed in claim 1 wherein the base member comprises one or more apertures.

12. An emissions cleaning module as claimed in claim 11 wherein a remainder of the base member defines one or more thermal paths between the roof member and the at least one seating location for an electronics module.

13. An emissions cleaning module as claimed in claim 1 further comprising an electronics module coupled to the base member at the at least one seating location.

14. An electronics support unit comprising:
a base member which defines at least one seating location for an electronics module; and
a roof member;
wherein, the roof member comprises a first end adjacent the base member and a free-standing second end distal the base member;
the roof member being shaped to extend up and over the base member such that a cavity is defined between the base member and the roof member and configured for receiving an electronics module to be seated at the at least one seating location, wherein the second end of the roof member includes one or more attachment points for coupling the roof member to a brace of the type including a cut-out in which the electronics support unit can be at least partially located.

15. An electronics support unit as claimed in claim 14 wherein the base member and the roof member are integrally formed.

16. An electronics support unit as claimed in claim 15 wherein the base member and the roof member are formed from a folded sheet.

17. An electronics support unit as claimed in claim 14 wherein the base member comprises a front edge, a rear edge and side edges joining the front edge and the rear edge; wherein the roof member extends upwardly from the rear edge of the base member; wherein the open-mouthed cavity is accessible from the front edge or the side edges of the base member.

18. An electronics support unit comprising:
a base member which defines at least one seating location for an electronics module; and
an attachment member;
wherein, the attachment member comprises a first end adjacent the base member and a second end distal the base member;
wherein the base member comprises one or more apertures creating one or more tortuous thermal paths between the attachment member and the at least one seating location for an electronics module, wherein the second end of the attachment member includes one or more attachment point for coupling the attachment member to a brace of the type including a cut-out in which the electronics support unit can be at least partially located.

* * * * *

UNITED STATES PATENT AND TRADEMARK OFFICE
CERTIFICATE OF CORRECTION

| | | |
|---|---|---|
| PATENT NO. | : 9,494,067 B2 | |
| APPLICATION NO. | : 14/394618 | |
| DATED | : November 15, 2016 | |
| INVENTOR(S) | : Naseer A. Niaz | |

It is certified that error appears in the above-identified patent and that said Letters Patent is hereby corrected as shown below:

Column 1, Line 4, below 'Title' insert -- CROSS-REFERENCE TO RELATED APPLICATION
This application is a U.S. National Phase of International Patent Application No. PCT/GB2012/053066, filed on Dec. 07, 2012, which claims priority benefit of British Patent Application No. 1207201.3, filed on April 24, 2012. Each of the above-referenced applications is hereby incorporated herein by reference in its entirety. --

Signed and Sealed this
Fourteenth Day of March, 2017

Michelle K. Lee
*Director of the United States Patent and Trademark Office*